United States Patent
Deligianni et al.

(10) Patent No.: US 9,447,514 B2
(45) Date of Patent: *Sep. 20, 2016

(54) ELECTRODEPOSITION OF THIN-FILM CELLS CONTAINING NON-TOXIC ELEMENTS

(71) Applicant: International Business Machines Corporation, Armonk, NY (US)

(72) Inventors: Hariklia Deligianni, Tenafly, NY (US); Lian Guo, Yorktown Heights, NY (US); Raman Vaidyanathan, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/699,550

(22) Filed: Apr. 29, 2015

(65) Prior Publication Data

US 2015/0233009 A1 Aug. 20, 2015

Related U.S. Application Data

(62) Division of application No. 13/222,266, filed on Aug. 31, 2011, now Pat. No. 9,085,829.

(60) Provisional application No. 61/378,577, filed on Aug. 31, 2010.

(51) Int. Cl.
  *C25D 5/10* (2006.01)
  *C25D 5/00* (2006.01)
  (Continued)

(52) U.S. Cl.
  CPC .............. *C25D 5/006* (2013.01); *C25D 5/10* (2013.01); *C25D 5/50* (2013.01); *C25D 7/12* (2013.01)

(58) Field of Classification Search
  CPC ............ C25D 5/10; C25D 5/48; C25D 5/50; C25D 3/58; C25D 5/006; H01L 31/00; H01L 31/02; H01L 31/0326
  USPC .......................... 438/48, 57, 85, 86; 205/340
  See application file for complete search history.

(56) References Cited

U.S. PATENT DOCUMENTS

| 4,492,811 A | 1/1985 | Switzer |
| 5,397,400 A | 3/1995 | Matsuno et al. |
| 9,085,829 B2 * | 7/2015 | Deligianni ............... C25D 3/58 |

(Continued)

OTHER PUBLICATIONS

Brownson et al., "Chemistry of Tin Monosulfide (δ-SnS) Electrodeposition Effects of pH and Temperature with Tartaric Acid", Journal of The Electrochemical Society, 155 (1) D40-D46 (2008).*

(Continued)

*Primary Examiner* — Bryan D. Ripa
(74) *Attorney, Agent, or Firm* — Cantor Colburn LLP; Vazken Alexanian

(57) ABSTRACT

A structure and method of making a thin-film solar cell is provided. A thin-film solar cell includes a substrate, absorber layer and a buffer layer. The absorber layer is deposited by a single-step bulk electrochemical process, or a multi-layer electrochemical process. The buffer layer is deposited by an electrochemical deposition process such as a multi-layer deposition or an atomic layer deposition. The absorber and buffer layers are non-toxic materials which can include sulfur incorporated during the deposition process or incorporated after deposition by an anneal step.

9 Claims, 1 Drawing Sheet

(51) Int. Cl.
*C25D 7/12* (2006.01)
*C25D 5/50* (2006.01)

(56) References Cited

U.S. PATENT DOCUMENTS

| | | |
|---|---|---|
| 2009/0011577 A1 | 1/2009 | Huang et al. |
| 2009/0111209 A1 | 4/2009 | Weidman et al. |
| 2009/0205714 A1 | 8/2009 | Kuhnlein et al. |
| 2010/0078059 A1 | 4/2010 | Lee et al. |
| 2010/0186805 A1 | 7/2010 | Krunks et al. |
| 2011/0011745 A1* | 1/2011 | Ji .................... C25D 7/126 205/91 |
| 2012/0227811 A1 | 9/2012 | Lau et al. |

OTHER PUBLICATIONS

G. Gordillo, et al., "Preparation and characterization of InxSey thin films deposited by co-evaporation," phys. stat. sol., vol. 220, p. 269-273, (2000).

G. Pezzatini, et al., "Formation of ZnSe on Ag(111) by electrochemical atomic layer epitaxy," J. of Electroanalytical Chemistry, 475 (1999), pp. 164-170.

J. Guillemoles, et al., "Indium-based interface chemical engineering by electrochemistry and atomic layer deposition for copper indium diseleide solar cells," Jpn. J. Appl. Phys., 40 (2001) pp. 6065-6068.

J.J Scragg, et al., "Synthesis and Characterization of Cu2SnSnS4 absorber layers by an electrodeposition-annealing route," Thin Solid Films 517, Nov. 8, 2008, pp. 2481-2484.

K.L Chopra, et al., "Thin-film solar cells: An Overview," Prog. Photovolt: Res. Appl.. V. 12, pp. 69-92, 2004.

N. Naghavi, et al., "Record efficiencies for dry processed Cd free CIGS solar cells with InS buffer layers prepared by ALD," 3rd World Conference on Photovoltaic Energy conversion, May 11-18, 2003, pp. 1-4.

X. Zhang, et al., "Electrochemical deposition of quaternary Cu2ZnSnS4 thin films as potential solar cell material," Springer-Verlag, Jul. 29, 2008, pp. 1-6.

Y. Ohtake, et al., "Development of ZnO/ZnSe/CIGS Thin-Film Solar Cells with Band Gap of 1.3 to 1.5 eV," IEEE, First WCPEC, Dec. 5-9, 1994, pp. 1-4.

\* cited by examiner

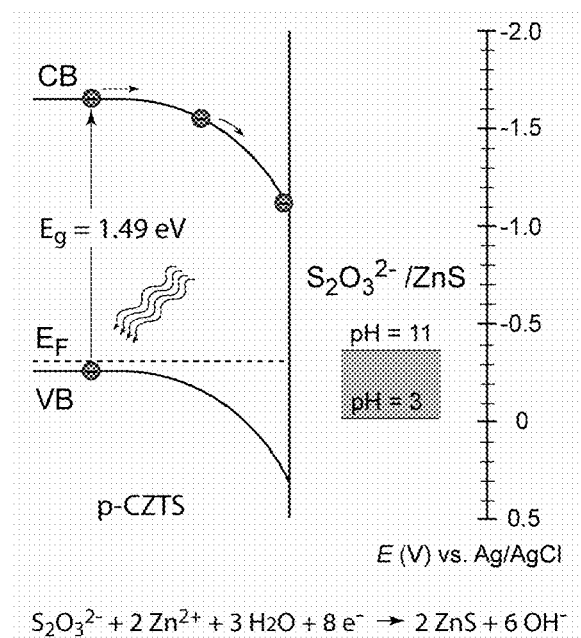

_US 9,447,514 B2_

ELECTRODEPOSITION OF THIN-FILM CELLS CONTAINING NON-TOXIC ELEMENTS

DOMESTIC PRIORITY

This application is a divisional application of U.S. patent application Ser. No. 13/222,266, filed Aug. 31, 2011, which claims priority under 35 U.S.C. §119(e) from U.S. Provisional Application No. 61/378,577 filed on Aug. 31, 2010 the entire contents of which are incorporated herein by reference.

BACKGROUND OF THE INVENTION

The present invention relates generally to electrochemical deposition methods and, more particularly, to electrochemical deposition methods for depositing thin-film cells containing non-toxic elements.

Thin-film photovoltaic cells are made by depositing thin layers of photovoltaic material. The photovoltaic layers include p-type and n-type layers. These layers can be made from a variety of photovoltaic materials and can be deposited using a variety of techniques.

The most commonly used materials for p-type layers include chalcopyrite materials, such as, copper indium gallium selenide (CIGS) and cadmium telluride (CdTe) which are toxic materials. The CIGS and CdTe layers are commonly deposited using methods including co-evaporation, sputtering, electrodeposition and colloidal deposition. The most commonly used material for the n-type layer is cadmium sulfide (CdS) which is also toxic. The CdS layer is commonly deposited using either sputtering or a chemical bath deposition.

There is a need to include a broader range of materials for use in thin-film photovoltaic cells. Specifically, there is a need for thin-film photovoltaic cells that use materials that are less toxic to the environment and that contain elements that are low cost and are more abundant in nature. In addition, there is a need for a process of depositing thin-film cells that offers low-cost processing and the ability to introduce a variety of different alloy materials as p-type and n-type layers.

BRIEF SUMMARY OF THE INVENTION

Accordingly, an aspect of the present invention provides a method of manufacturing thin-film cells. A substrate is provided. An absorber layer is deposited onto the substrate. A buffer layer is deposited onto the absorber layer using an electrochemical deposition process.

Another aspect of the present invention provides a thin-film cell structure. The structure includes a substrate, an absorber layer deposited onto the substrate using a single-step bulk electrochemical deposition process and a buffer layer deposited onto the absorber layer using an electrochemical atomic layer deposition process.

Other features and advantages of the invention will become apparent from the detailed description and the accompanying drawing that follows.

BRIEF DESCRIPTION OF THE SEVERAL VIEWS OF THE DRAWINGS

FIG. 1 depicts a band diagram of p-CZTS at the liquid junction with aqueous solution under external bias of −0.35 V (vs. Ag/AgCl).

DETAILED DESCRIPTION OF THE INVENTION

Electrochemical deposition, including single-step bulk, multi-layered and atomic layered methods, offers the advantages of being low cost compared to other deposition methods and allows for the introduction of a variety of different quaternary, ternary and binary alloys as photovoltaic materials. These methods of deposition can be combined in order to produce efficient thin-film cells containing non-toxic materials with relatively low production costs.

The p-type layer, or absorber layer, is relatively thicker than the n-type layer. The fast single-step bulk electrochemical deposition method is best suited for the absorber layer.

The n-type layer, or buffer layer, is relatively thinner than the p-type layer. The slow process of electrochemical atomic layer deposition is best suited for the buffer layer.

It is desirable to manufacture thin-film cells in photovoltaic devices without using toxic materials. Accordingly, absorber and buffer layers that do not contain cadmium (Cd) are proposed here. Further, fabrication of ternary absorber layers that do not contain cadmium (Cd), indium (In) or gallium (Ga) are also proposed.

A first aspect of the invention provides a method of manufacturing thin-film cells. The method includes providing a substrate, depositing an absorber layer onto the substrate, and depositing a buffer layer onto the absorber layer using an electrochemical deposition process.

The step of depositing the absorber layer can be carried out using either (1) single-step bulk electrochemical deposition, (2) multi-step electrochemical deposition or (3) electrochemical atomic layer deposition.

The step of depositing the buffer layer can be carried out using either (1) multi-step electrochemical deposition or (2) electrochemical atomic layer deposition.

One advantage of electrochemical deposition is the ease to control the driving force of the involved chemical reactions by simply adjusting the electrode potential.

Referring to FIG. 1, a band diagram of p-CZTS at the liquid junction with aqueous solution under external bias of −0.35 V (vs. Ag/AgCl) is shown. By applying a more negative potential (see scale on the right), the Fermi level ($E_F$) of the electrode (dashed line) can be moved upwards, which can be considered roughly as the average energy of free electrons (i.e., with high tendency to take part in redox reactions).

For metal electrodes, when moving the Fermi level ($E_F$) above the potential of a specified redox reaction in the solution phase (ex. the bar labeled by pH=3), electrons are injected into oxidative species of the redox couple (here is $S_2O_3^{2-}$) and convert them into corresponding reductive species (in this example it is ZnS).

However, for a semiconductor electrode, things work differently because of the so-called band-bending which is illustrated for conduction band (CB) and valence band (VB) near the p-CZTS/solution interface changes. The band-bending forms because of the charge accumulation on the solution side of the solid-liquid junction as well as the low free charge carrier density of semiconductors.

In the dark, there are few electrons in the CB, and hence the only pathway to inject electrons into the redox couple in solution and make the deposition occur is thru the VB. As shown in FIG. 1, although the Fermi level EF is higher than the redox potential of $S_2O_3^{2-}$/ZnS in most pH range between 3 and 11, the VB valence band edge is still lower than the redox potential by 0.3-0.7 V due to the band-bending. The deposition cannot occur due to the energy barrier of 300-700 mV.

In contrast, if light shines on the semiconductor electrode, electrons on the VB can be excited into the CB, and then migrate downhill into CB edge at the interface, which is energetically higher than the redox potential of $S_2O_3^{2-}$/ZnS. Therefore, the reaction can take place spontaneously under illumination at all pH ranges.

The absorber layer and the buffer layer can be made from non-toxic materials. The absorber layer material can include $Cu_2ZnSeS_4$, $Cu_2SnSeS_4$, $Cu_2ZnSn(SeS)_4$, $Cu_2ZnSnTe_4$, and $Cu_2ZnSnS_4$. Other materials that can work as either the absorber layer or the buffer layer can include $In_2Se_3$, $In_2S_3$, $In_2Te_3$, ZnSe, ZnTe, ZnS, SnSe, SnTe and SnS. Other materials that can also work are binary alloys including group II-VI materials, group III-V materials, group III-VI materials and group IV-VI materials.

The absorber materials containing sulfur can be deposited by including sulfur in the solution bath during electrochemical deposition, or by annealing in the presence of sulfur (solid) and/or hydrogen sulfide ($H_2S$) in an Argon (Ar) containing atmosphere in order to implant sulfur into the thin-film.

In one embodiment of the present invention, the absorber layer is a thin-film of $Cu_2ZnSn$. This is carried out by contacting: (i) a solution including: 1 mM to 100 mM of $CuSO_4 \cdot 5H_2O$; 1 mM to 100 mM of $SnSO_4$; about 1 mM to 100 mM of $ZnSO_4$; 20 mM to 5M of NaOH solution; and 0.1 M to 2 M of sorbitol solution; and (ii) the substrate. The pH of the solution can be adjusted by using more or less NaOH solution. The pH of the solution should range from about 9 to about 12. While the solution and the substrate are in contact, a voltage is applied to the substrate of about −0.4 V to about −1.5 V with reference to a Ag/AgCl reference electrode. The electric current evoked in the substrate should range from about 5 $mA/cm^2$ to about 40 $mA/cm^2$.

If the solution used contains 1 mM to 100 mM of $Na_2S$, then the above process will produce a thin-film of $Cu_2ZnSnS_4$. Alternatively, the thin-film of $Cu_2ZnSn$ can be annealed in the presence of sulfur (solid) and/or hydrogen sulfide ($H_2S$) in an Argon (Ar) containing atmosphere for about 1 hour at a temperature of 550 degrees Celsius, thereby producing a thin-film of $Cu_2ZnSnS_4$.

In another embodiment of the present invention, the buffer layer is a thin-film of $In_2Se_3$. The preferred method of depositing a buffer layer of $In_2Se_3$ is to use electrochemical atomic layer deposition. This process is carried out using a repeated process using an indium solution, a selenium solution and a blank rinse solution. The indium solution includes 1 mM to 500 mM $InSO_4$; 0.1 M to 1 M of $NaClO_4$; and 10 mM to 1000 mM of $C_2H_3NaO_2$. The selenium solution includes 0.1 mM to 500 mM of $SeO_2$; 0.1 to 1 M of $NaClO_4$; and about 10 mM to 100 mM of $C_2H_3NaO_2$. The blank rinse solution includes 0.1 M to 1 M of sodium perchlorate and 10 mM to 100 mM of sodium acetate. All of the solutions have a pH adjusted to about 3 to about 10.

The process is carried out by filling a cell with the indium solution. The absorber layer is exposed to a light source. Then a voltage is applied to the substrate of about −0.1 V to about −1 V with reference to a Ag/AgCl reference electrode for about 1 to 100 seconds. While maintaining the voltage, the cell is rinsed for about 1 to 100 seconds using the blank rinse solution. Then, the cell is filled with the selenium rinse solution. The absorber layer is exposed to a light source. The same voltage is applied to the substrate of about −0.1 V to about −1 V with reference to the Ag/AgCl reference electrode for about 1 to 100 seconds. Again, the cell is rinsed for about 1 to 100 seconds using the rinse solution while the voltage is maintained.

The above process is repeated for 1 to 2000 cycles and for each cycle the voltage applied to the electrode is increased by about −0.001 V up to a voltage of about −1 V. The end result is a thin-film of $In_2Se_3$.

In another preferred embodiment of the present invention, the buffer layer is a thin-film of ZnS. The preferred method of depositing a buffer layer of ZnS is to use electrochemical atomic layer deposition. This process is carried out using a repeated process using a zinc solution, a sulfur solution and a blank rinse solution. The zinc solution includes about 1 mM to 1000 mM $ZnSO_4$ buffered with $NH_3$. The sulfur solution includes about 0.1 mM to 1M $Na_2S$ buffered with $NH_3$. The blank rinse solution is an ammonia buffered solution. All of the solutions have a pH adjusted to about 9 to 12.

The process is carried out by filling a cell with the zinc solution. The absorber layer is exposed to a light source. Then a voltage is applied to the substrate of about −0.4 V to about −1.5 V with reference to a saturated calomel reference electrode for about 1 to 100 seconds. While maintaining the voltage, the cell is rinsed for about 1 to 100 seconds using the blank rinse solution. Then, the cell is filled with the sulfur solution. The absorber layer is exposed to a light source. The same voltage is applied to the substrate of about −0.4 V to about −1.5 V with reference to the Ag/AgCl reference electrode for about 1 to 100 seconds. Again, the cell is rinsed for about 1 to 100 seconds using the rinse solution and the voltage is maintained.

The above process is repeated for 1 to 2000 cycles and for each cycle the voltage applied to the electrode is increased by about −0.001 V up to a voltage of about −1 V or by about +0.001 V down to a voltage of about −0.1 V. The end result is a thin-film of ZnS.

In another preferred embodiment of the present invention, the absorber layer is a thin-film of SnS. The thin-film of SnS is deposited by filling a cell with a solution including: $SnCl_2$; $Na_2S_2O_3$; and about 0.2 mM of tartaric acid. The pH of the solution is adjusted to about 2.5. The temperature of the solution is adjusted to about 70 degrees Celsius. The absorber layer is exposed to a light source. A voltage is applied to a substrate in the cell. The voltage applied should be about −0.8 V with reference to a Ag/AgCl reference electrode.

The thin-film structure includes a substrate, an absorber layer deposited onto the substrate using a single-step bulk electrochemical deposition process and a buffer layer deposited onto the absorber layer using an electrochemical atomic layer deposition process. The thickness of the thin-film cell ranges from about 50 nm to about 3 µm. The absorber layer and the buffer layer are made from non-toxic materials. The absorber layer material can include $Cu_2ZnSeS_4$, $Cu_2SnSeS_4$, $Cu_2ZnSn(SeS)_4$, $Cu_2ZnSnTe_4$ or $Cu_2ZnSnS_4$. The absorber layer and the buffer layer material can include $In_2Se_3$, $In_2S_3$, $In_2Te_3$, ZnSe, ZnTe, ZnS, SnSe, SnTe or SnS.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method of manufacturing a thin-film cell, the method comprising:
providing a substrate;
depositing an absorber layer onto the substrate; and
depositing a buffer layer onto the absorber layer, wherein the absorber layer and the buffer layer are made from non-toxic materials;
wherein the depositing the absorber layer and the buffer layer is performed using an electrochemical atomic layer deposition process carried out under illumination so as to excite electrons from a valence band to a conduction band, wherein the electrons at an edge of the conduction band at a solid/liquid interface are energetically higher than that of a redox potential of $S_2O_3^{2-}/ZnS$; and
wherein the electrochemical deposition process for depositing the buffer layer is carried out by:
filling a cell with a solution comprising: $SnCl_2$; $Na_2S_2O_3$; and about 0.2 mM of tartaric acid;
adjusting a pH of the solution to about 2.5;
adjusting a temperature of the solution to about 70 degrees Celsius;
exposing the absorber layer to a light source; and
applying a voltage to the substrate of about −0.8 V with reference to a Ag/AgCl reference electrode to produce a thin-film of SnS.

2. The method of claim 1, wherein the step of depositing the absorber layer onto the substrate is carried out using a single-step bulk electrochemical deposition process.

3. The method of claim 1, wherein the absorber layer is made of a material selected from the group consisting of $Cu_2ZnSeS_4$, $Cu_2SnSeS_4$, $Cu_2ZnSn(SeS)_4$, $Cu_2ZnSnTe_4$ and $Cu_2ZnSnS_4$.

4. The method of claim 1, wherein the step of depositing the absorber layer onto the substrate is carried out using multiple-layer electrochemical deposition.

5. The method of claim 1, wherein the step of depositing the absorber layer onto the substrate is carried out using a single-step bulk electrochemical deposition process and wherein the electrochemical deposition process used to deposit the buffer layer is a multiple layer electrochemical deposition process.

6. The method of claim 1, wherein the step of depositing the absorber layer onto the substrate is carried out by:
depositing a thin-film of $Cu_2ZnSn$ using an electrochemical deposition process, wherein sulfur is not contained in a solution used in the process; and
annealing the thin-film in the presence of sulfur (solid) and/or hydrogen sulfide ($H_2S$) in an Argon (Ar) containing atmosphere in order to implant sulfur into the thin-film of $Cu_2ZnSn$.

7. The method of claim 1, wherein the step of depositing the absorber layer onto the substrate is carried out by:
contacting: (i) a solution comprising: 1 mM to 100 mM of $CuSO_4 \cdot 5H_2O$; 1 mM to 100 mM of $SnSO_4$; 1 mM to 100 mM of $ZnSO_4$; 20 mM to 5M NaOH solution; and 0.1 M to 2 M of sorbitol solution; and (ii) the substrate;
adjusting a pH of the solution to a range from about 9 to about 12; and
applying a voltage to the substrate of about −0.4 V to −1.5 V with reference to a Ag/AgCl reference electrode to produce a thin-film of $Cu_2ZnSn$.

8. The method of claim 7, wherein the solution further comprises about 1 mM-1000 mM of $Na_2S$, thereby producing a thin-film of $Cu_2ZnSnS_4$.

9. The method of claim 7, further comprising:
annealing the thin film of $Cu_2ZnSn$ in the presence of sulfur (solid) and/or hydrogen sulfide ($H_2S$) in an Argon (Ar) containing atmosphere for about 1 hour at a temperature of 550 degrees Celsius, thereby producing a thin-film of $Cu_2ZnSnS_4$.

* * * * *